| United States Patent [19] | [11] | 4,151,609 |
|---|---|---|
| Moss | [45] | Apr. 24, 1979 |

[54] FIRST IN FIRST OUT (FIFO) MEMORY

[75] Inventor: William E. Moss, Sunnyvale, Calif.

[73] Assignee: Monolithic Memories, Inc., Sunnyvale, Calif.

[21] Appl. No.: 840,827

[22] Filed: Oct. 11, 1977

[51] Int. Cl.$^2$ .................... G11C 13/00; G11C 21/00
[52] U.S. Cl. ........................ 365/221; 365/78; 365/233; 307/221 R; 307/238; 328/37
[58] Field of Search ............ 365/221, 78; 307/221 R, 307/211 D; 328/37

[56] References Cited

U.S. PATENT DOCUMENTS

| 2,842,682 | 7/1958 | Clapper | 307/221 R |
| 3,297,950 | 1/1967 | Lee | 365/78 |
| 3,573,754 | 4/1971 | Merryman | 365/78 |
| 3,676,701 | 7/1972 | Kasperkouitz | 307/221 R |
| 3,851,187 | 11/1974 | Pao | 307/221 R |

*Primary Examiner*—Terrell W. Fears
*Attorney, Agent, or Firm*—Harry M. Weiss

[57] ABSTRACT

This disclosure is directed to a First In First Out memory which comprises a register, an input control section, a register control section, and an output control section. The imput control section allows data to be entered into the First In First Out memory while the register control section shifts the data through the memory queing up at the locations closest to the output. The output control allows data to be taken out of the FIFO at a different rate than data is entered into the memory by the input control section. The register control section monitors the succeeding location and the previous location in the register to determine when data may be shifted in the register.

14 Claims, 6 Drawing Figures

FIRST IN FIRST OUT (FIFO) MEMORY

BACKGROUND OF THE INVENTION

1. Field of the Invention

This invention relates generally to memory systems and more particularly to First In First Out bipolar semiconductor memory systems which are especially useful as a buffer type memory in an electronic system application.

2. Description of the Prior Art

In the past, semiconductor memory systems have been developed which generally fall into two basic categories, namely dynamic memories and static memories. Dynamic semiconductor memories are made of either bipolar or MOS type components, and are characterized by the need to periodically refresh charge on various portions of the memory circuit in order to maintain a stored information state. On the other hand, semiconductor static memories are made of bipolar or MOS type components which are constantly connected to an energy source so that there is no need to refresh the memory circuits.

The static and dynamic memory systems in general are used as a memory storage function wherein information, during one period of time, is written into the memory system and the stored information, during another period of time, is subsequently read out of the memory system. One major disadvantage with this type of memory system operation is that it does not permit information to be written into the memory system at the same time that information is read out of the memory system.

Memory system designers have been particularly interested in recent times in developing memory systems that could function substantially as a First In First Out memory unit wherein data that is entered into the memory system will be sequentally passed through the memory system. One additional advantage of a FIFO memory system over a conventional sequential memory system is that data can be entered into the memory system at various speeds while at the same time data can be taken out of the memory system at the same or different speeds. The data or information that is first entered into a FIFO type memory system will be the first available data for output from the system. This has previously been done using fairly sophisticated software techniques and more recently, has been implemented in hardware using MOS type components. However, MOS implementation of a FIFO memory system is substantially slow.

Accordingly, a need existed to develop a high speed bipolar First In First Out semiconductor memory system which could be operated at speeds that are many times the speed of existing MOS FIFO memory systems.

SUMMARY OF THE INVENTION

It is an object of this invention to provide an improved First In First Out semiconductor memory system.

It is another object of this invention to provide an improved First In First Out bipolar semiconductor memory system.

It is still a further object of this invention to provide a high speed First In First Out bipolar semiconductor memory system.

The foregoing, and other objects, features and advantages of the invention will be apparent from the following, more particular description of the preferred embodiment of the invention, as illustrated in the accompanying drawings.

GENERAL LOGIC OPERATION

Figure 1A:
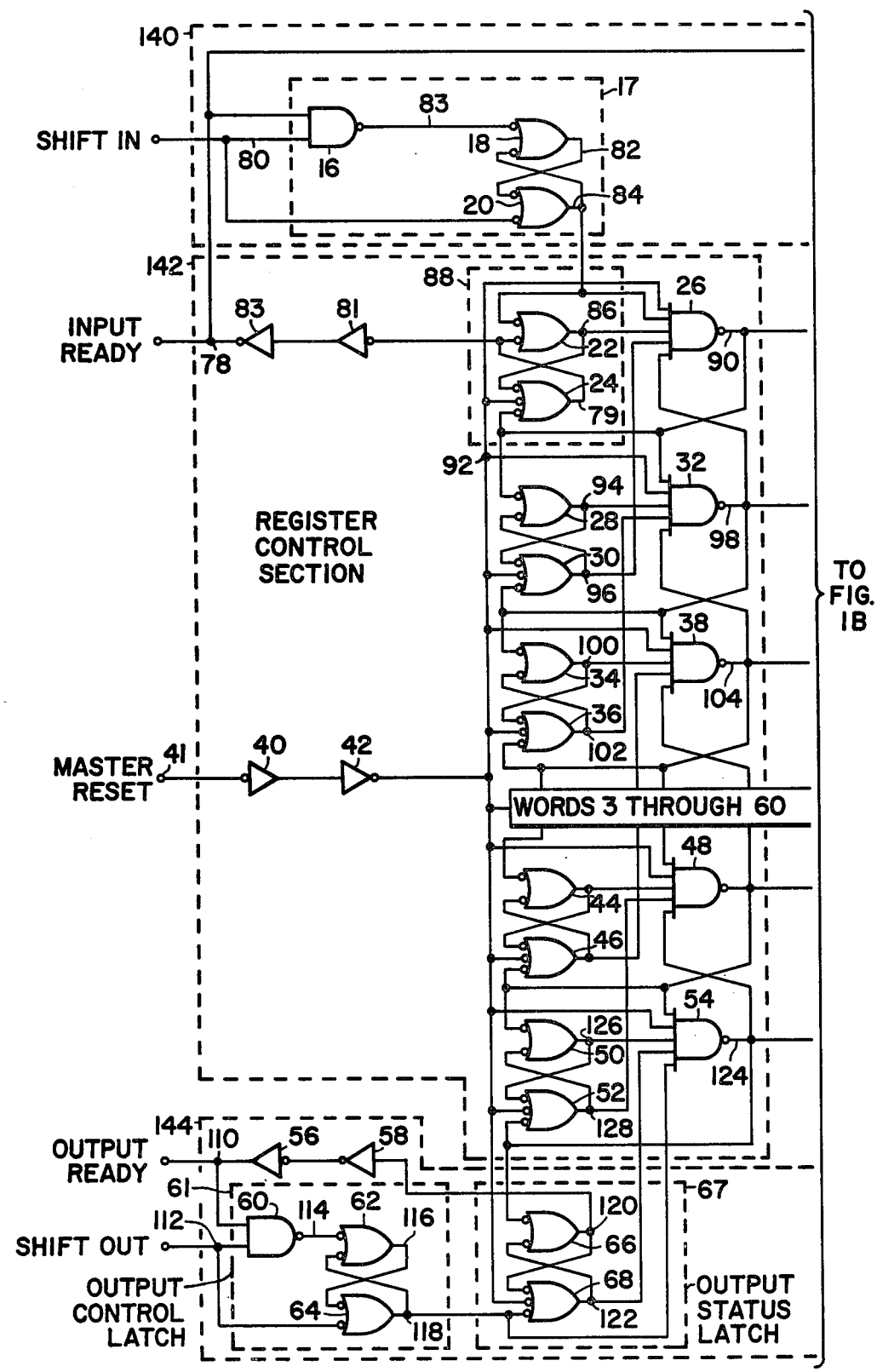
FIGS. 1A and 1B are, respectively, the two halves of a logic diagram of the First In First Out bipolar semiconductor memory system of this invention.
Figure 1B:
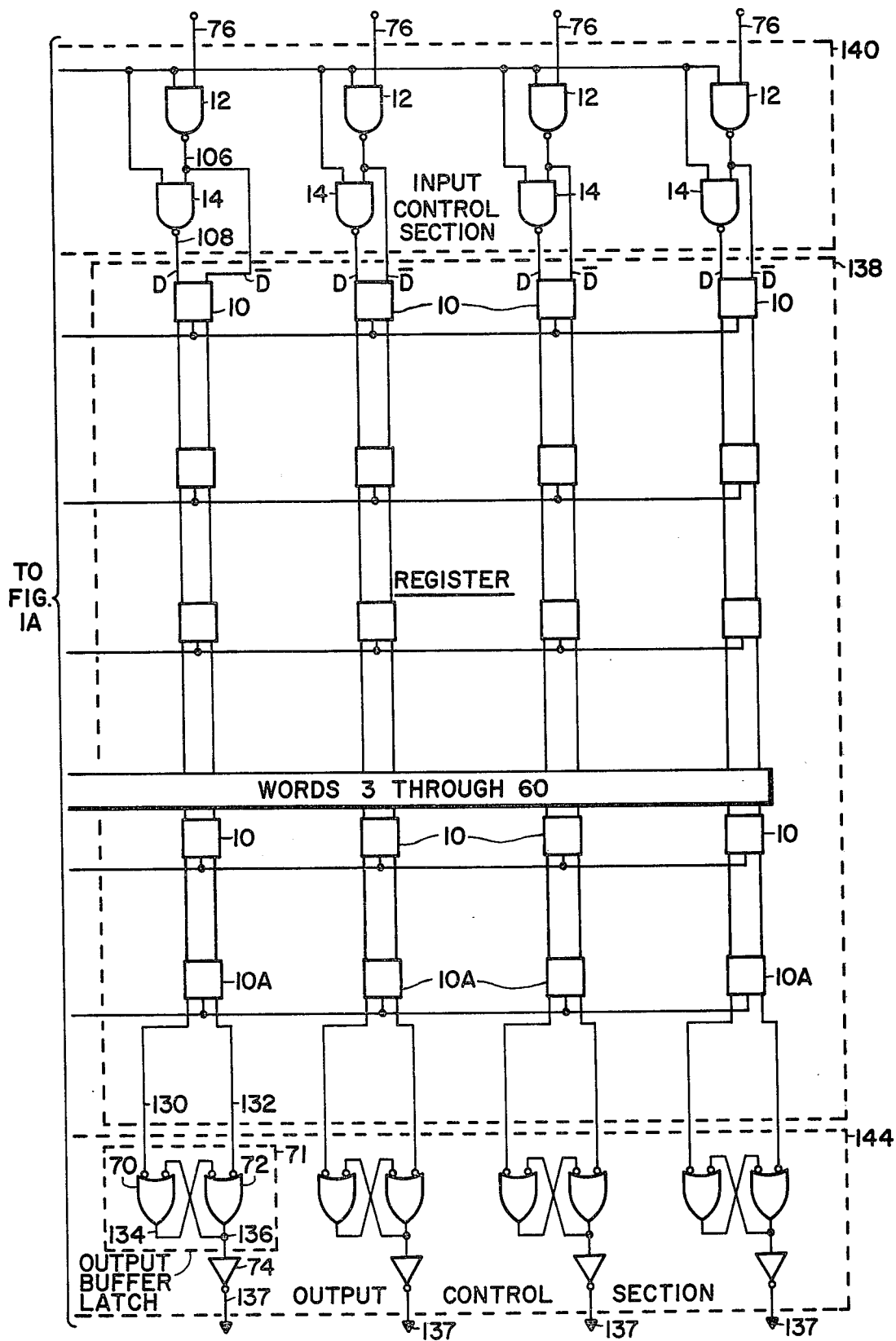
Figure 2A:
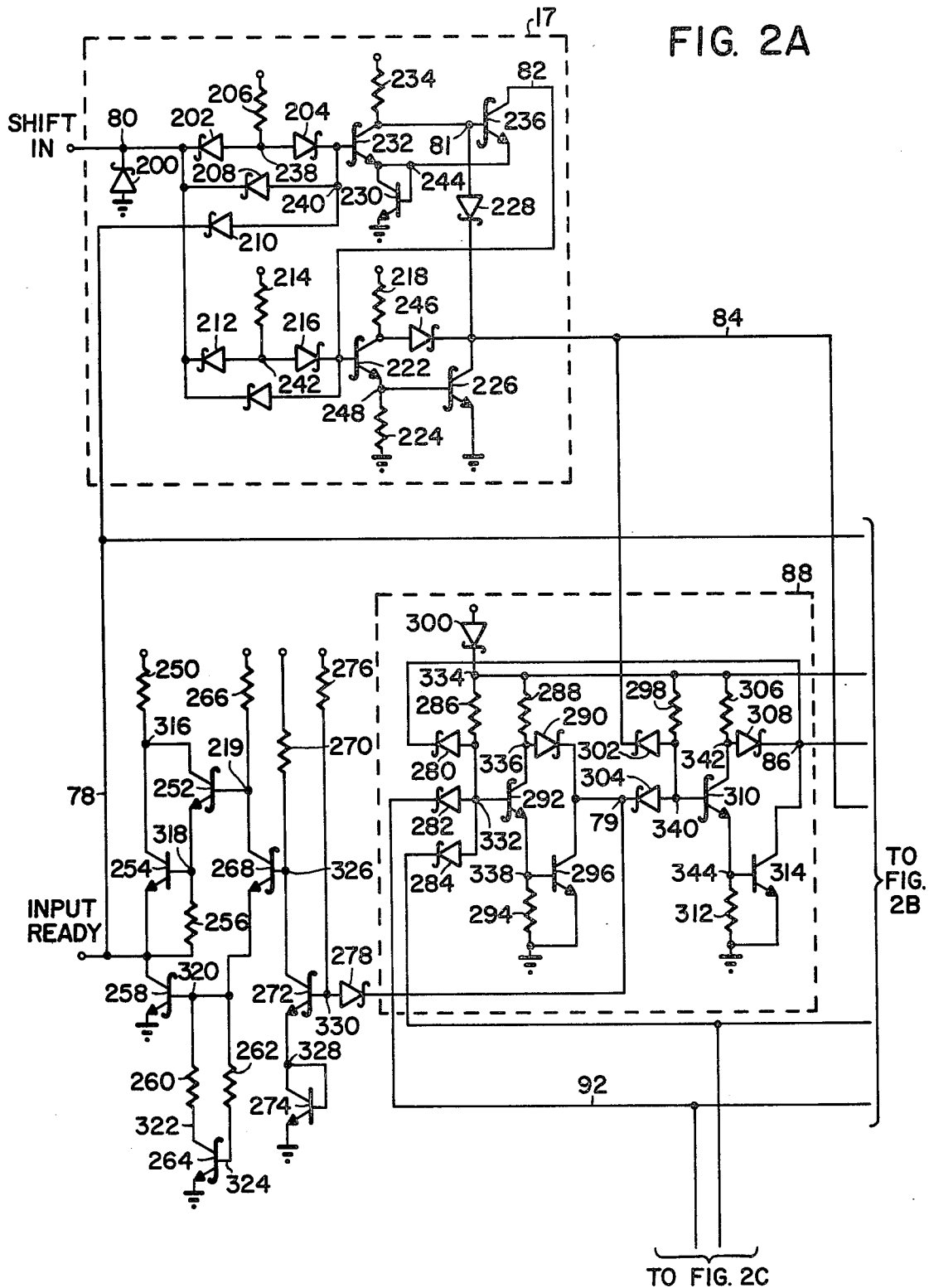
FIGS. 2A, 2B, 2C and 2D are the four parts, when connected up together as shown, which provide an electrical schematic diagram of the logic diagram shown in FIGS. 1A and 1B.
Figure 2B:
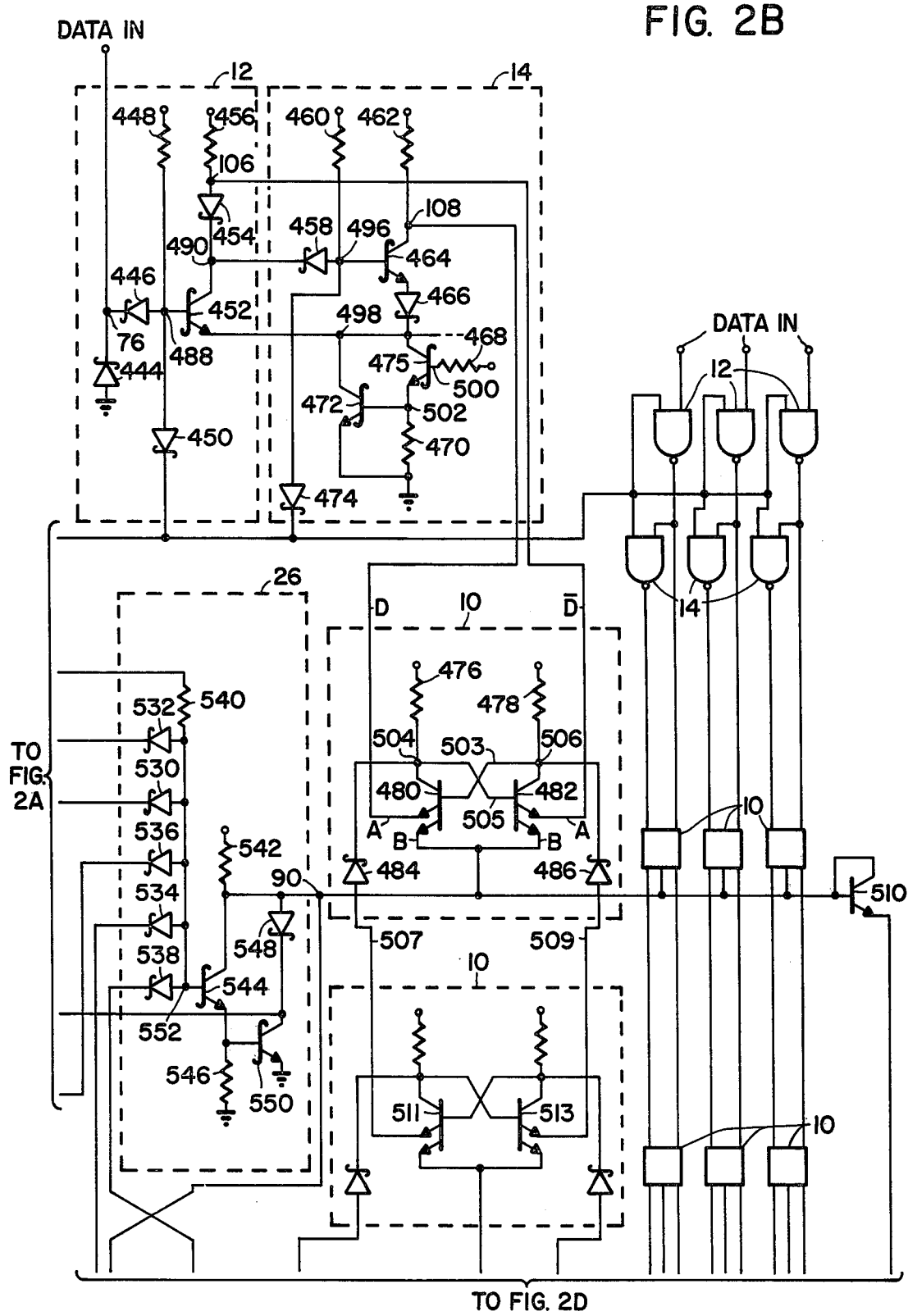
Figure 2C:
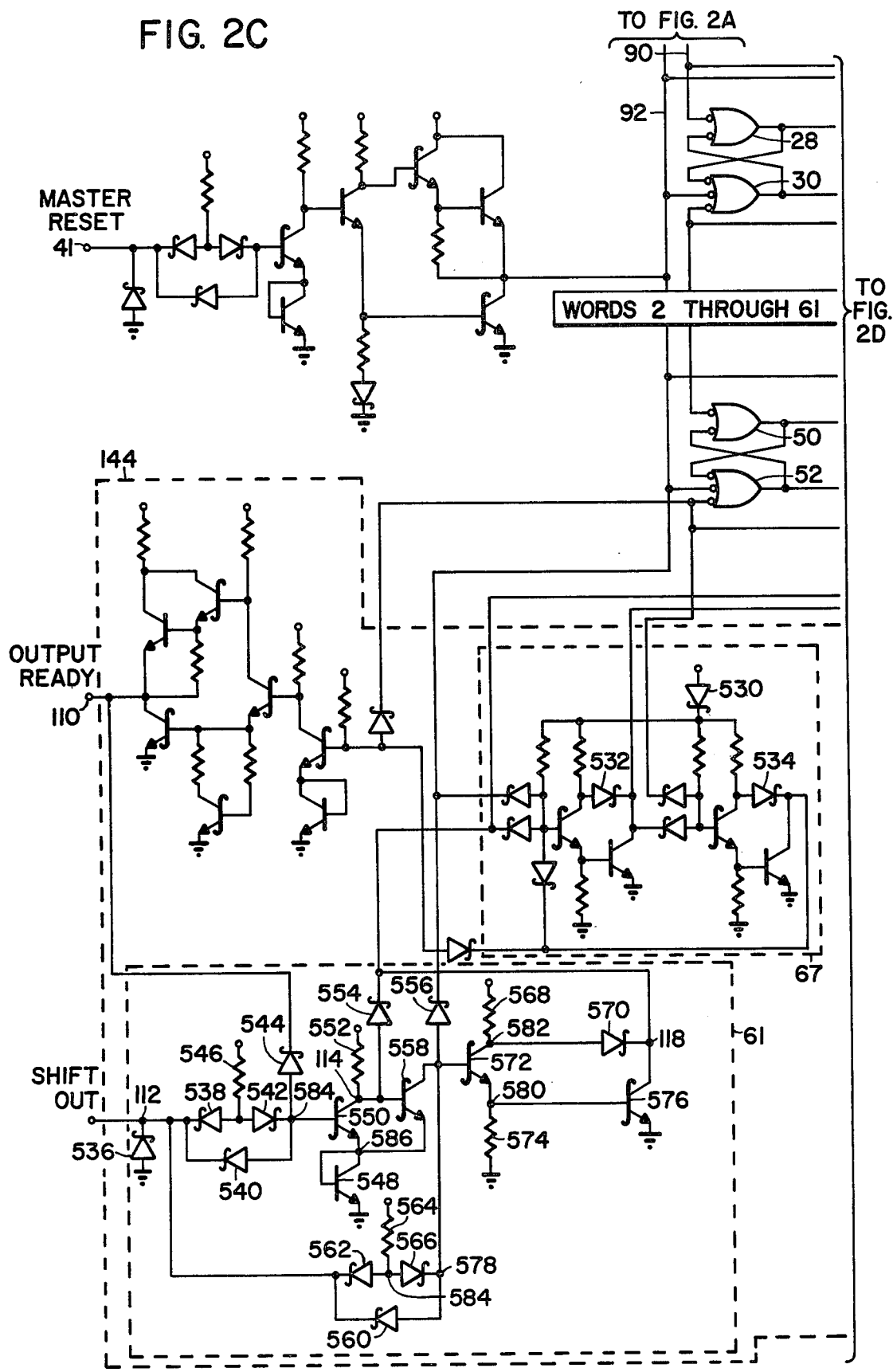
Figure 2D:
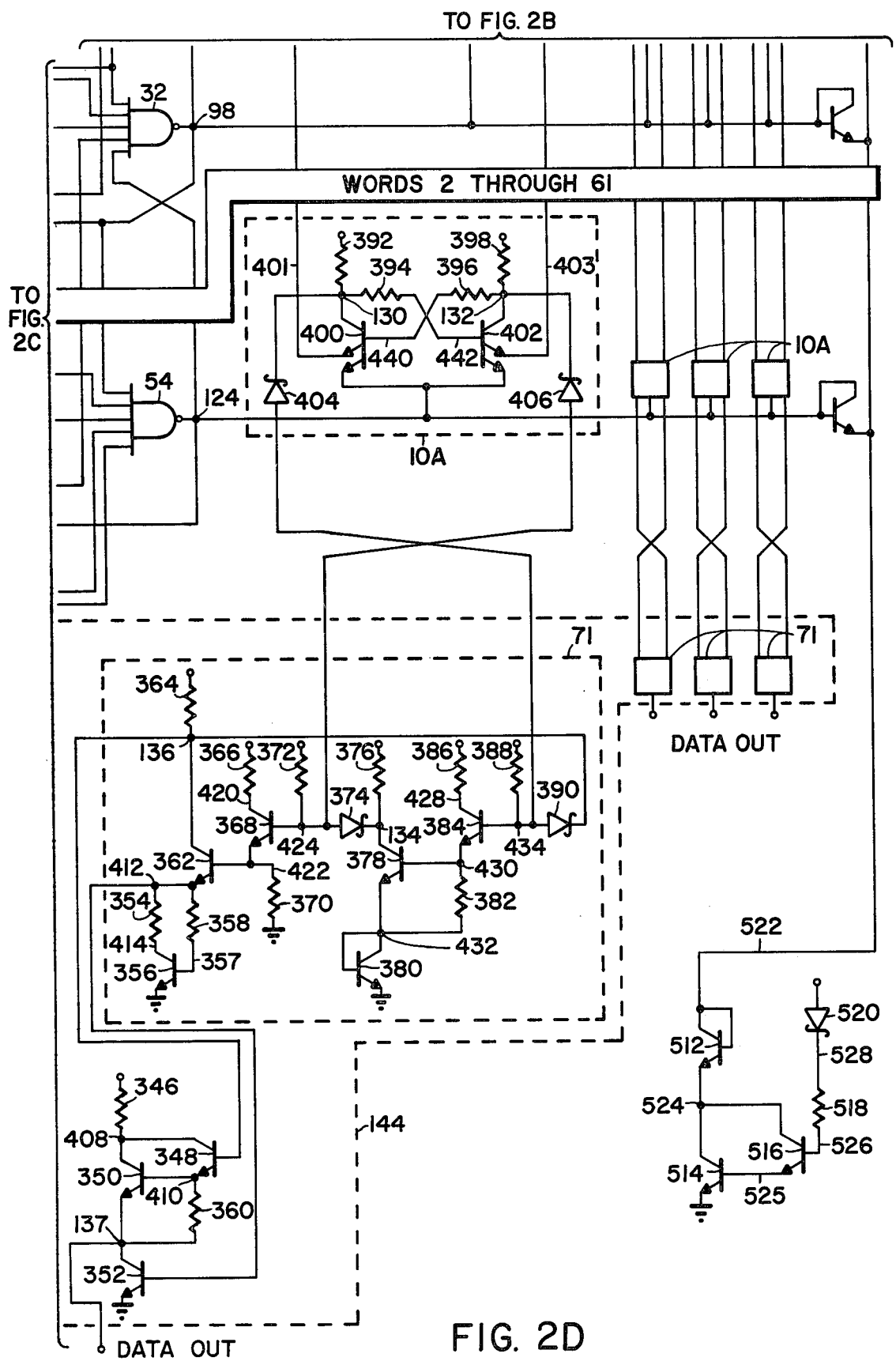

Referring to FIGS. 1A and 1B, the FIFO Buffer (or Memory System of this invention) comprises a Register 138 (see FIG. 1B) of Flip-Flop Memory Cells 10 and 10A (a Register Control Section 142 (FIG. 1A), an Input Control Section 140 (FIGS. 1A and 1B) and an Output Control Section 144 (FIGS. 1A and 1B). The Memory Cells 10 and 10A are arranged as N words of Y bits each, with the specific embodiment of this disclosure being sixty-three words of four bits each. An additional word is stored in Output Buffer Latches 71 (see FIG. 1B) for a total of 64 words. Each four bit word location of this embodiment is controlled by a Word Line 90 (see FIG. 1A) and may receive data from the previous word or transfer data to the succeeding word location. Word location 0 which is the top row of four memory cells 10 of FIG. 1B receives data from Data-In Lines 76 via the Input Control Section 140 (all shown in FIG. 1B). Word location 62 is the row of memory cells 10A that is located above the Output Control Section 144. This Word location transfers data to Data-Out Lines 137 via the Output Control Section 144.

Data is shifted through the Register 138 under control of the Register Control Section 142. When a word location contains data, the Register Control Section 142 inhibits transfer of new data from the previous word location and checks the next word location in the Register 138 to determine if it is empty, thus ready to receive data. If the next word location is empty, the data is transferred. This cycle is repeated until data is shifted to the last word location of the Register 138 or until a word location already containing data is encountered.

Master Reset 41 provides an initialization input capability. When Master Reset 41 is taken low to a Logic "0" level inverting Buffer Gates 40 and 42 cause Node 92 to go low (see FIG. 1A). This resets Word Status Latch 88 for all word locations indicating that they do not contain valid data and resets Output Status Latch 67 (FIG. 1A) indicating Output Buffer Latch 71 (FIG. 1B) does not contain valid data. The Register 138 is not cleared by the Master Reset 41. If it is desired to clear the Register 138, it may be loaded sequentially with zeros.

DATA INPUT

The Input Control Section 140 comprises Input Buffer Gates 12 and 14 (see FIG. 1B) and Input Control Latch 17 formed by Gates 16, 18 and 20 (see FIG. 1A). Input Ready Line 78 (see FIG. 1A) indicates Word location 0 is ready to accept new input data by outputting a logic "ONE" or high voltage level. A "ZERO" or low level on the Input Ready Line 78 indicates Word location 0 is holding data or is in the process of transferring data to Word location 1. When the Input Ready Line 78 is high, Gates 12 and 14 (FIG. 1B) are enabled.

Data-In 76 is inverted by the Gate 12 and presented to the $\overline{D}$ Input 106 of the Memory Cell 10 and to the input of the Gate 14. $\overline{D}$ Input 106 is inverted by the Gate 14 and applied to the D-Input 108 of the Memory Cell 10. Thus, the true representation of the Date-In 76 is presented to the D-Input 108 and the complement of the Data-In 76 is presented to the $\overline{D}$ input 106 of the Memory Cell 10.

The Input Control Latch 17 (see FIG. 1A) is controlled by the Input Ready 78 and Shift-In 80. When Input Ready 78 and Shift-In 80 are simultaneously high, the output 83 of Gate 16 goes low and sets the Input Control Latch 17 formed by the Gates 18 and 20 such that Output 82 is high and Output 84 is low. The Output 84 when high causes the Word Status Latch 88 to set such that Output 86 is low and Output 79 is high. This causes Word Line 0 90 to be held high at the output of Gate 26. The Input Ready 78 is thus set to a low state through inverting Buffer Gates 81 and 83 and inhibits Gates 12 and 14 by causing D 108 and $\overline{D}$ 106 to be driven high. At this point, information present at the Data-In 76 is latched into Word location 0 of of the Register 138. The shifting of data from the first word to the second word of the Register 138 is controlled by the Word Line 0 90. When all five inputs to Gate 26 are high, the Word Line 0 90 is driven low and the data is shifted to the second word location.

DATA SHIFTING

Five conditions must be met to transfer data from the first to the second word location of the Register 138. First, the Word Status Latch 88 must be set for the Word location 0 indicating the first word location contains latched data. Second, the Input Control Latch 17 must be reset indicating that the Shift-In 80 has returned to a low state. Third, the next Word Status Latch formed by Gates 28 and 30 for the Word location 1 must be reset with Output 96 high, indicating that the second word location does not presently contain data. Fourth, Word Line 1 98 must be high indicating it is not presently transferring data from the second to the third word location in the Register 138. Fifth, the Master Reset 41 must be high.

The data transfer process for the Word location 0 begins when the Shift-In 80 is driven low after data has been latched into the first word location of the Register 138. The Shift-In 80 going low forces Output 84 of the Gate 20 high, thus resetting the Input Control Latch 17. This satisfies the second criteria for transfer explained above, the first being satisfied when the Word Status Latch 88 for Word location 0 was previously set by the Input Control Latch 17. If the second word location already contains data or is presently transferring data, the first word location must wait for the data to be transferred out of the second word location as indicated by its Word Status Latch being reset and the Word line 1 98 returning to a high level. If the second word location does not contain data, these conditions will have been met previously. At this point, all inputs to the Gate 26 are high causing the Word line 0 90 to go low and enable the transfer of data from the first word location to the second word location of the Register 138. The Word line 0 90 going low also resets its Word Status Latch 88 indicating it no longer contains data and sets the Word Status Latch of the Word location 1 indicating that it now contains data. Two gate propagation delays later, (through Gates 24 and 22 and through Gates 28 and 30) a low is presented to the Inputs 86 and 96 of the Gate 26 causing the Word line 0 90 to return to a high level. Thus the time allowed for transfer of data is three gate propagation delays including the delay through the Gate 26. A reduced supply voltage as explained below in the Circuit section, is used to ensure that this time is sufficient for reliable operation.

Data transfers are similar for the remainder of the Register 138. Gates 34, 44 and 50 are equivalent in function to the Gates 22 and 28. Gates 36, 46 and 52 are equivalent in function to the Gates 24 and 30. Gates 38, 48 and 54 are Word line driven gates similar in function to the Gates 26 and 32. Thus when a word location in the Register 138 contains data and sees an empty word location ahead of it, the data is transferred. In this manner, data is shifted through the Register 138 to the available word location closest to the output.

DATA OUTPUT

The Output Control Section 144 (see FIG. 1A) comprises the Output Control Latch 61, the Output Status Latch 67, the Output Buffer Latch 71, and inverting Buffer Gates 56, 58 (FIG. 1A) and 74 (see FIG. 1B). Outputs from the Output Control Section 144 are four Data Out lines 137 (FIG. 1B) and Output Ready line 110 (FIG. 1A). The output 122 of the Output Status Latch 67 and the Output Control Latch Output 118 are internally fed back to Gate 54 thus controlling Word location 62 data transfers. Inputs to the Output Control Section 144 are Shift Out 112 and the buffered Master Reset Line 92 explained earlier. Word line 62 124 is internally connected to the Output Status Latch 67.

When the Output Ready 110 is at a high level, this indicates that data is available in the Output Buffer Latch 71. The Output Status Latch 67 is set with Output 120 high, thereby providing the Output Ready signal 110 through the two inverting Buffer Gates 56 and 58. If the Shift Out 112 is driven high, the Output Control Latch 61 is set and the Output Status Latch 67 is reset causing the Output Ready 110 to go low. This indicates to the FIFO that data is being transferred from the device through the Data Out outputs 137. When the Shift Out 112 is returned to a low the Output Control Latch 61 is reset. At this point, Inputs 118 and 122 to Gate 54 are high, allowing Word line 62 124 to transfer new data from Word location 62 to the Output Buffer Latch 71. When data is transferred to the Output Buffer Latch 71, the Output Status Latch 67 is set by the Word line 62 124 causing Output Ready 110 to be driven high by inverting Buffer Gates 56 and 58.

CIRCUIT DESCRIPTION

The circuit implementation of the FIFO memory is shown in FIGS. 2A, 2B, 2C and 2D. Preferably, Schottky TTL circuit techniques are used, combined with high resistivity ion implanted resistors. A reduction in overall die size is possible using the high resistivity implanted resistors while allowing much better control of values than standard resistor diffusion methods. The net effect is a smaller die or chip resulting in higher manufacturing yields. All unlabeled terminals are connections to the Vcc positive supply connection. Voltage levels are referenced to ground unless specified otherwise. Transistors having an elongated S shaped base region are Schottky type transistors.

In Input Control Latch 17 (FIG. 2A) is implemented using combined gating structures to reduce the number of parts required. These structures employing less than the full complement of parts for a standard Schottky TTL gate may be used since internal nodes with predictable voltage levels are involved rather than external signals requiring noise margin considerations. Shift-In 80 is a standard Schottky TTL input with Schottky Diode 200 clamping to catch negative voltage transients. A Schottky Diode 208 is added to the basic input structure to provide faster turn-off of phase splitter Transistor 232. When the Shift-In 80 and the Input Ready 78 are both high, the phase splitter Transistor 232 is turned on by current through Resistor 206 and Schottky Diode 204. This presents a low voltage between the Base 81 and Emitter node 244 of Transistor 236, thus turning it off. A Diode connected transistor 230 provides a voltage drop equivalent to a normal output stage in order to set a proper TTL input threshold. Phase splitter Transistor 222 is turned on by current through Resistor 214 and Schottky Diode 216. Current through Resistor 218 and Transistor 222 turns on Transistor 226 forcing a low level on line 84. Schottky Diode 228 couples the output line 84 back to the Base 81 of Transistor 236 thus setting the Input Control Latch 17 with the line 84 low and output line 82 high. When the Input Ready 78 goes low, the drive current to Transistor 232 is shunted through a Schottky Diode 210 thus turning off Transistor 232. Schottky Diode 210 is connected directly to the Node 240 rather than Node 238 since it is driven directly by an internal gate output and external input noise margin is not required. When Transistor 232 turns off, the current flowing through Resistor 234 flows into Schottky Diode 208. The voltage at the Node 81 of Transistor 236 is held at a saturation voltage of Transistor 226 plus a Schottky diode drop. Since two forward base-emitter drops are required at Node 81 to turn on Transistor 236, it remains off and the latch remains set. When Shift-In 80 is taken low, the Input Control Latch 17 is reset through Schottky Diode 212. The current through Resistor 214 flowing through Schottky Diode 216 to turn on Transistor 222 is diverted through Schottky Diode 212 thus turning off Transistor 222. When Transistor 222 turns off, it turns off Transistor 226 allowing output line 84 to be pulled high by Resistor 218 and Schottky Diode 246. With a high voltage at the output line 84, Schottky Diode 228 now allows Node 81 to go high and turn on Transistor 236 thus completing the latching action. If Transistor 232 had not been previously turned off by the Input Ready 78 going low, it would be turned off through Schottky Diode 208 and the operation of the latch would be identical to that described above.

The Input Ready 78 is buffered by a double inverting structure which is similar to the standard TTL 74LS08 circuit. The Input Schottky Diode 278 has its cathode connected to Node 79. The purpose of this buffer is to provide output drive capability and isolate the Word Status Latch 88 from external influence. The Word Status Latch 88 is implemented with structures similar to the Standard 74LS TTL family of circuits with an exception. The Driver Transistors 252 and 254 and the Resistors 250 and 256 used in the Input Ready 78 buffer gate, are replaced with Schottky Diodes 290 and 308. This is possible since external drive capability and standard TTL levels are not required. The Word Status Latch 88 is operated at a voltage which is one Schottky Diode 300 drop below the supply voltage. This effectively slows down the Latch 88 and provides a slightly longer negative going pulse on the Word Line 90, allowing increased time for data transfer to be completed.

The Data-In 76 Buffer Gates 12 and 14 (see FIG. 2B) are designed to provide proper input levels to the Memory Cell 10. Transistors 472 and 475 are constantly turned on, by current at base 500 through a Resistor 468 returned to Vcc, to provide a level of approximately 1.0 volt, created by one base-emitter drop plus one saturation voltage, at Node 498. When the Data-In 76 (FIG. 2B) and the Input Ready 78 (FIG. 2A) are simultaneously high, Input Schottky Diodes 446 and 450 are reverse biased and Transistor 452 is turned on by base current through Resistor 448. The $\overline{D}$ 106 line is driven low to a level of the Transistor 452 saturation voltage and a Schottky Diode 454 drop above Node 498. The $\overline{D}$ 106 line thus has a potential of approximately 1.6 volts with respect to ground. Transistor 464 is turned off since Schottky diode 458 pulls current through Resistor 460 and the voltage at the Node 496 of Transistor 464 is less than required for turn-on. In this case, the Transistor 452 saturation voltage plus the Schottky Diode 458 forward drop is less than the Schottky Diode 466 forward drop plus the Transistor 464 base-emitter drop required for turn-on. The net result is that the D 108 line is pulled high to approximately the supply voltage by Resistor 462 and the $\overline{D}$ 106 line is pulled to approximately 1.6 volts. If Data-In is low, these potentials are reversed with $\overline{D}$ 106 high and D 108 low. When Input Ready 78 goes low, base drive is removed from Transistor 452 by Schottky Diode 450 and from Transistor 464 by Schottky Diode 474, causing both D 108 and $\overline{D}$ 106 to go high. A clamp Schottky Diode 444 is provided at the Data In 76 Input to catch negative voltage transients.

The Memory Cell 10 comprises two dual emitter Transistors 480 and 482, two Resistors 476 and 478 and two Schottky Diodes 484 and 486. Each dual emitter transistor consists of two Emitters a and b having a common Collector Node 504 or 506 and a common Base lead 503 or 505. The common Collector Node 504 of Transistor 480 is connected to the common Base lead 505 of Transistor 482 and the common Base lead 503 of Transistor 480 is connected to the common Collector Node 506 of Transistor 482 such that the dual emitter devices are connected in a bistable latch configuration. The Emitter 480B of Transistor 480 is connected to Emitter 482B at a common node which is Word Line 0 90. Emitter 480A is connected to the D 108 input line and Emitter 482A is connected to the $\overline{D}$ 106 input line. The Collector Node 504 of Transistor 480 is connected to a Resistor 476 and to the cathode of a Schottky Diode 484. The Resistor 476 is also connected to the supply voltage while the anode of the Schottky Diode 484 is connected to the Emitter input 507 of Transistor 511 which is equivalent in function to Emitter 480A in the Memory Cell 10 of the next word. Resistor 478 and Schottky Diode 486 are connected similarly to the Collector Node 506 of Transistor 482 and the anode of Schottky Diode 486 is connected to the Emitter input 509 which is equivalent in function to Emitter 482A in the Memory Cell 10 of the next word.

When the Word Line 0 90 is high, it has a voltage determined by base-emitter diode drops of Transistors 510 (FIG. 2B), 512 (FIG. 2D) and 514 (FIG. 2D) plus the saturation voltage of Transistor 516. The Transistor 516 is turned on constantly by base current through Resistor 518 and Schottky Diode 520 which is connected to the supply voltage. Transistor 516 supplies base current to the Base 525 of Transistor 514 keeping it constantly turned on. The collectors of Transistors 514 and 516 are common at Node 524 and maintain a voltage of the base-emitter drop of Transistor 514 plus the saturation voltage of Transistor 516. The net result is a high level clamp on Word Line 0 90 of approximately 2.5 volts. When Word Line 0 90 is pulled low by Transistor 550 through Schottky Diode 548 it assumes a level of approximately 0.8 volts (see FIG. 2B).

Assume Data-In 76 is high and Word Line 0 90 is high. The $\overline{D}$ 106 line at approximately 1.6 volts causes conduction through Emitter 482A causing current to flow through Resistor 478 and Transistor 482. The Emitter 482B of the Transistor 482 is reverse biased since Word Line 0 90 is high at approximately 2.5 volts. With Transistor 482 turned on, the Collector Node 506 assumes a level one saturation voltage above $\overline{D}$ 106 or approximately 2.0 volts. Thus Emitter 480D is reverse biased by approximately 0.5 volts and Emitter 480A is reverse biased by the supply voltage minus the 2.0 volts on the Base 503 of Transistor 480, keeping the Transistor 480 turned off. When the Input-Ready 78 is driven low causing both D 108 and $\overline{D}$ 106 to go high, the Memory Cell 10 will retain the data latched into it. Under these conditions, conduction is maintained (through Transistor 482 by Emitter 482B) to the Word Line 0 90. The cross coupling of the cell keeps Transistor 480 turned off by maintaining its base-emitter voltage at a saturation level. The Collector Node 504 of Transistor 480 maintains a voltage of the base-emitter drop of the Transistor 482 above the Word Line 0 90 while the Collector Node 506 of the Transistor 482 maintains a saturation voltage above Word Line 0 90. Thus a differential voltage drop of one base-emitter drop minus one saturation voltage. About 0.5 volts exists from the Collector Node 504 of Transistor 480 to the Collector Node 506 of Transistor 482. If Data-In 76 had been assumed to be low, Transistor 480 would have been turned on and Transistor 482 turned off by a similar process.

Data is transferred from Word location 0 to Word location 1 by causing Word Line 0 90 to go low to approximately 0.8 volts. Assume Transistor 482 is conducting and Transistor 480 is turned off, and assume that Word Line 1 98 (see FIGS. 2B and 2D) is high at approximately 2.5 volts indicating Word location 1 does not contain data. The Input 509 to the Memory Cell 10 in Word location 1 is equivalent in function to the $\overline{D}$ 106 input to the Memory Cell 10 in Word location 0, and the Input 507 is similarly equivalent to D 108. When Word Line 0 90 goes low, the Schottky Diode 486 conducts current causing Input 509 to be pulled low to approximately 1.6 volts while Input 507 is approximately 0.5 volts higher due to the differential voltage across the Memory Cell 10 in Word location 0. Transistor 513 is turned on and Transistor 511 (both in Word location 1) is held off in the same manner previously described with respect to D 108 and $\overline{D}$ 106 inputs into the Memory Cell 10 of Word location 0. When Word Line 0 90 returns high, data is latched into the Memory Cell 10 of Word location 1 in a similar manner as explained for Word location 0 when D 108 and $\overline{D}$ 106 were both driven high by the action of Input Ready 78 going low. Transfers of data between the other Memory Cells 10 in the Register 138 are similar in operation.

The Memory Cell 10A (see FIG. 2D) used in Word location 62 is slightly modified from the Memory Cell 10. Two Resistors 394 and 396 are added between the Bases 440 and 442 and the Collectors Nodes 130 and 132 of dual emitter Transistors 400 and 402. The result is to increase the differential voltage across the Memory Cell 10A to provide better voltage levels for driving the Output Buffer Latch 71.

The Output Buffer Latch 71 (see FIG. 2D) comprises two NAND gates 70, 72 (see FIG. 1B) cross coupled as a bistable latch, with an output buffer stage 74 to provide external drive capability. Gate 70 (see FIG. 1B) comprises Schottky diodes 404 and 390 (see FIG. 2D) representing input nodes 130 and 136 (see both FIG. 1B and 2D), respectively. The anode connection node 434 of the Schottky diodes 390 and 404 connect to the base node 434 of a Transistor 384 and to a Resistor 388, the other end of which is connected to Vcc. The Collector 428 of Transistor 384 is connected to a Resistor 386 which is connected to Vcc. The Emitter of Transistor 384 is connected to the base of Transistor 378 at Node 430 and to a Resistor 382 the other end of which is connected to the Emitter Node 432 of Transistor 378 and the common Connection 432 of the collector and base of Transistor 380. The emitter of Transistor 380 is connected to a ground. The collector Node 134 of Transistor 378 is connected to the cathode node 134 of a Schottky diode 374 and to a Resistor 376 which is connected to Vcc. Schottky diodes 406 and 374 form the input nodes 132 and 134, respectively, to Gate 72 in FIG. 1B. The anode connection node 424 of Schottky diodes 374 and 406 is connected to a Resistor 372 and to the base node 424 of Transistor 368. The collector node 420 of Transistor 368 is connected to a Resistor 366 which is connected to Vcc. The Emitter 422 of Transistor 368 is connected to the base 422 of Transistor 362 and to a Resistor 370 which is connected to ground. The collector node 136 of Transistor 362 is also the cathode node 136 of Schottky diode 390, the base node 136 of Transistor 348, and the node 136 of 364 which is connected to Vcc. The Emitter Node 412 of Transistor 362 is connected to the Base Node 412 of a Transistor 352 and to two Resistors 354 and 358. Resistor 354 is connected to the Collector 414 of Transistor 356 and Resistor 358 is connected to the base 357 of Transistor 356. The Collector Node 137 of Transistor 352 is connected to the Emitter node 137 of Transistor 350 and to Resistor 360. The Base node 410 of Transistor 350 is connected to the other end of Resistor 360 and to the Emitter node 410 of Transistor 348. Transistors 348 and 350 have a common Collector node 408 which is also connected to Resistor 346 which is connected to Vcc.

Assume Word Line 62 124 goes low to transfer data from Word location 62 to the Output Buffer Latch 71. Assume further that Transistor 400 is on and Transistor 402 is off.

The voltage levels in the Memory Cell 10A are somewhat similar to those previously discussed for the Memory Cell 10 with the following differences: The logic "1" or high level appearing at the Collector node 132 of Transistor 402 will be slightly higher than the equivalent node 506 (see FIG. 2B) in Memory Cell 10 due to the voltage drop across Resistor 396. A similar situation exists for a logic "1" or high level appearing at the Collector node 130 of Transistor 400 when compared with the Collector node 504 of Transistor 480. When Word Line 62 124 goes low to approximately 0.8 volts, the Collector node 130 of Transistor 400 is pulled to a level of approximately 1.0 volts and the Collector node 132 of Transistor 402 is pulled to approximately 2.1 volts. This results in forward biasing Schottky diode 404 while Schottky diode 406 remains reverse biased. The anode of Schottky diode 404 is pulled to approximately 1.4 volts thus turning off Transistors 384, 378, and 380. The Collector node 134 of Transistor 378 is pulled high by Resistor 376 reverse biasing Schottky diode 374. Since the Cathode node 132 of Schottky diode 406 is held at approximately 2.1 volts, the Base node 424 of Transistor 368 is pulled up by Resistor 372 until Transistors 368, 362, 356 and 352 turn on with the Base node 424 of Transistor 368 being at approximately 2.1 volts. Schottky diode 406 is not conducting at this time. The Collector node 136 of Transistor 362 pulls current through Resistor 364 and through Schottky diode 390 and Resistor 388 maintaining a voltage at Node 136 of the base to emitter drop of Transistor 352 plus the saturation voltage from the Collector node 136 to the Emitter node 412 of Transistor 362, or approximately 0.9 volts. Since the Base node 434 of Transistor 384 is now held low by Schottky diode 390, the data is latched into the Output Buffer Latch 71 and Word Line 62 124 may be taken high. The Base node 412 of Transistor 348 is held at approximately 0.9 volts and its emitter is connected to Resistor 360 which may have 0.2 volts to 0.5 volts applied to it at Data Out node 137. Thus, transistor 348 may be turned on slightly, but the current driven into the Collector node 137 of Transistor 352 will be limited to a small value by Resistor 360. Transistor 350 is off since less than one forward base-emitter drop will be generated across Resistor 360. The Resistor 346 to Vcc from the common Collector node 408 of Transistors 348 and 350 limits the short circuit current of the Output node 137 and decreases switching transient current in the output stage. Circuit operation is similar for the case when Transistor 400 is off and Transistor 402 is on.

The Output Status Latch 67 (see FIG. 2C) is implemented with standard Schottky TTL gates equivalent to type 74LS00 with two exceptions. The Schottky diode 530 is used to lower the Vcc voltage applied to the gates in order to slightly increase delay times and provide more time for data transfer from Word location 62 to the Output Buffer Latch 71. Also, the Schottky diodes 532 and 534 are used as output pull up devices (rather than using active transistors) since external drive is not required. The Output Ready 110 buffer/inverter gates 56 and 58 (see FIG. 1A) are implemented with a circuit functionally equivalent to a standard 74LS08.

The Output Control Latch 61 is implemented using combined circuit gating techniques. The Schottky diode 536 provides a clamp on the Shift Out 112 input to catch negative going voltage transients. Schottky diodes 538, 540, 542, 560, 562 and 566 and Resistors 546 and 564 form the inputs to Gates 60 and 64 (see also FIG. 1A). Operation of this type input has been described above. Transistor 548 provides a voltage drop equivalent to an output transistor in order to set a proper TTL threshold at Shift Out 112. Assume Shift Out 112 is high indicating a request to transfer data to the Output Buffer Latch 71. If Output Ready 110 is high, Transistor 550 is turned on by current from Vcc through Resistor 546 and Schottky diode 542. Schottky diode 544 is not conducting since its anode node 584 is held at approximately 1.4 volts and its Cathode connection 110 is driven high to approximately 3.6 volts. Transistor 558 is held off by the saturation voltage of Transistor 550 across its Base node 114 to Emitter node 586. Transistor 572 is turned on by current from Vcc through Resistor 564 and Schottky diode 566. Transistor 576 is turned on by current from the Emitter node 580 of Transistor 572. The Collector node 582 of Transistor 572 is at a voltage level of approximately 0.9 volts and collector current is provided by Resistor 568 which is connected to Vcc. Schottky diode 570 is not conducting or is only slightly conducting at this time. The Collector node 118 of Transistor 576 is connected to the Cathode node 118 of Schottky diode 554 to provide cross coupling and implement the latch. The anode node 114 of Schottky diode 554 is connected directly to the output of Gate 60. Since the Collector node 114 of Transistor 550 is pulled up by a Resistor 552, this node point 114 may be forced low by Schottky diode 554 and Transistor 576. The voltage level of approximately 0.6 volts at the Base node 114 of Transistor 558 is low enough to hold it off and complete the latching action. The Output Ready 110 line may now go low, turning off Transistor 550 by shunting its base current through Schottky diode 544. The Output Ready 110 line goes low when the Output Status Latch 67 is reset by the action of Transistor 576 turning on. The Output Control Latch 61 remains set with Output node 118 low until Shift Out 112 is taken to a low level. When Shift Out 112 is taken low, base drive is removed from Transistor 572. Schottky diode 562 is forward biased causing current to flow through Resistor 564 and through Schottky diode 562. The voltage at the Cathode node 578 of Schottky diode 566 will be approximately equal to the input voltage or about 0.8 volts macimum. This level is low enough to ensure that Transistor 572 is turned off. Consequently base drive is removed from Transistor 576 causing it to turn off. Schottky diode 560 provides a path for stored charge removal from Transistor 572 thus decreasing turn off delay. Resistor 574 provides a similar function for Transistor 576. Transistor 550 is held off at this point since the current through Resistor 546 flows through Schottky diode 538 and is not available as base drive. Output Ready 110 may be high or low after Shift Out 112 is taken low with no effect on Transistor 550 since no base drive will be available. Resistor 552 provides current to the Base node 114 of Transistor 558 causing it to turn on. The Collector node 578 of Transistor 558 sits at a voltage of approximately 0.9 volts. Thus if Shift Out 112 were taken high while Output Ready 110 was low, the Output Control Latch 61 would remain reset since Transistor 572 would be held off by Transistor 558.

While the invention has been particularly shown and described with reference to the preferred embodiments above, it will be understood by those skilled in the art that the foregoing and other changes in the form and details may be made therein without departing from the spirit and scope of the invention.

What is claimed is:

1. A First in First Out bipolar memory system comprising, in combination, a plurality of bipolar registers for storing words of information, word transfer means coupled to said plurality of registers for shifting the contents of said plurality of registers to the next sequential register, said word transfer means including word control means for indicating (a) when a register can accept new information, (b) when a register is presently storing information, and (c) when a register is transferring information, bipolar input control means coupled to the first of said plurality of registers for controlling entry of said words into said plurality of registers and preventing entry of new information into the first register when said first register is already storing information, and bipolar output control means coupled to the last of said plurality of registers.

2. A First In First Out bipolar memory system in accordance with claim 1 wherein said plurality of bipolar registers comprises a plurality of bipolar memory cells.

3. A First In First Out bipolar memory system in accordance with claim 2 wherein said plurality of bipolar registers further comprises word control lines connected to said plurality of bipolar memory cells.

4. A First In First Out bipolar memory system in accordance with claim 1 wherein said word transfer means comprises master reset means for resetting the word transfer means to its initial condition for indicating that there is no information in said plurality of bipolar registers.

5. A First In First Out bipolar memory system in accordance with claim 1 wherein said word transfer means comprises input ready means for detecting when the first word location is available to take new information.

6. A First In First Out bipolar memory system in accordance with claim 1 wherein said word transfer means comprises word control line driver means for controlling the shifting of information from one word location to the next word location.

7. A First In First Out bipolar memory system in accordance with claim 1 wherein said bipolar input control means comprises shift in control means for signalling the bipolar input control means to accept new information from an external source of information.

8. A First In First Out bipolar memory system in accordance with claim 1 wherein said bipolar input control means comprises data input means for accepting information from an external source of information.

9. A First In First Out bipolar memory system in accordance with claim 1 wherein said bipolar input control means comprises input buffer gate means for accepting external information and convering said external information to the proper voltage and current levels in order to provide information to the first of said bipolar registers means.

10. A First In First Out bipolar memory system in accordance with claim 1 wherein said bipolar output control means comprises output buffer latch means for holding the last word of information and buffering said last word of information to proper voltage and current levels for external use.

11. A First In First Out bipolar memory system in accordance with claim 1 wherein said bipolar output control means comprises output ready means for detecting when information is present on the outputs of said bipolar output control means.

12. A First In First Out bipolar memory system in accordance with claim 1 wherein said output control means comprises shift out control means for shifting information from the next to the last to the last word location in said bipolar register means.

13. A First In First Out bipolar memory system in accordance with Claim 12 wherein said bipolar output control means comprises output control latch means for latching the shift out control means until said shifting of information is complete and for detecting when the bipolar register means is empty of any information.

14. A First In First Out bipolar memory system in accordance with claim 11 wherein said bipolar output control means comprises output status latch means for detecting the presence of information in the last word location and latching said output ready means when information is shifted to the last word location.

* * * * *